(12) United States Patent
Lee et al.

(10) Patent No.: US 10,553,807 B2
(45) Date of Patent: Feb. 4, 2020

(54) FUNCTIONAL LAYER FOR ORGANIC ELECTRON DEVICE CONTAINING NON-CONJUGATED POLYMER HAVING AMINE GROUP, AND ORGANIC ELECTRON DEVICE CONTAINING SAME

(71) Applicant: GWANGJU INSTITUTE OF SCIENCE AND TECHNOLOGY, Gwangju (KR)

(72) Inventors: Kwanghee Lee, Gwangju (KR); Hongkyu Kang, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 14/404,599

(22) PCT Filed: Nov. 30, 2012

(86) PCT No.: PCT/KR2012/010336
§ 371 (c)(1),
(2) Date: Nov. 28, 2014

(87) PCT Pub. No.: WO2013/180361
PCT Pub. Date: Dec. 5, 2013

(65) Prior Publication Data
US 2015/0107674 A1    Apr. 23, 2015

(30) Foreign Application Priority Data

May 29, 2012    (KR) ........................ 10-2012-0056933

(51) Int. Cl.
*H01L 51/42*    (2006.01)
*H01L 51/50*    (2006.01)
(Continued)

(52) U.S. Cl.
CPC ...... *H01L 51/5056* (2013.01); *H01L 51/0059* (2013.01); *H01L 51/0508* (2013.01);
(Continued)

(58) Field of Classification Search
CPC ............. H01L 51/5056; H01L 51/0059; H01L 51/0508; H01L 51/44; H01L 51/5016; H01L 51/5072; H01L 51/52
(Continued)

(56) References Cited

FOREIGN PATENT DOCUMENTS

KR        100633115 B1    10/2006
KR    1020070099474 A    10/2007
(Continued)

OTHER PUBLICATIONS

Machine Translation of Korean patent document 10-2011-0085821 from KIPO website.*
(Continued)

*Primary Examiner* — Eli S Mekhlin
*Assistant Examiner* — Kourtney R S Carlson
(74) *Attorney, Agent, or Firm* — Hauptman Ham, LLP (57) ABSTRACT

A functional layer for an organic electronic device, which contains a non-conjugated polymer having an amine group, and an organic electronic device including the same. An organic electronic device includes a first electrode, a second electrode, and one or more organic material layers disposed between the first electrode and the second electrode, wherein the organic material layers include an electron transport layer, and the electron transport layer contains polyallylamine or polylysine.

5 Claims, 8 Drawing Sheets

(51) Int. Cl.
  *H01L 51/00* (2006.01)
  *H01L 51/05* (2006.01)
  *H01L 51/44* (2006.01)
  *H01L 51/52* (2006.01)

(52) U.S. Cl.
  CPC .......... *H01L 51/44* (2013.01); *H01L 51/5016* (2013.01); *H01L 51/5072* (2013.01); *H01L 51/52* (2013.01)

(58) Field of Classification Search
  USPC .................................................. 136/242–265
  See application file for complete search history.

(56) References Cited

FOREIGN PATENT DOCUMENTS

| KR | 1020100082556 A | 7/2010 |
|---|---|---|
| KR | 1020110085821 A | 7/2011 |
| KR | 1020120046386 A | 5/2012 |

OTHER PUBLICATIONS

Al-Hariri, Lara A. "Polyelectrolytes in Optoelectronics and Biomaterials." Thesis. Florida State University, 2011. Florida State University Libraries.*
Helander, Michael G., Mark Greiner, and W. M. Tang. "Work Function of Fluorine Doped Tin Oxide." Journal of Vacuum Science and Technology 29.1 (2011): 011019-1-11019-4.*
Koch, N., A. Elschner, J. Schwartz, and A. Kahn. "Organic Molecular Films on Gold versus Conducting Polymer: Influence of Injection Barrier Height and Morphology on Current-voltage Characteristics." Applied Physics Letters 82.14 (2003): 2281-283.*
"Polylysine." Wikipedia. Wikimedia Foundation, Mar. 21, 2017.*
Du Pasquier, Aurelien, et al. "Conducting and Transparent Single-Wall Carbon Nanotube Electrodes for Polymer-Fullerene Solar Cells." Applied Physics Letters, vol. 87, No. 20, 2005, pp. 203511-1-203511-3., doi:10.1063/1.2132065. (Year: 2005).*
(Supportive Materials for Exception on May 2, 2012) Hongkyu Kang et al., Electrostatically Self-Assembled Nonconjugated Polyelectrolytes as an Ideal Interfacial Layer for Inverted Polymer Solar Cells, Advanced Materials, pp. 3005-3009, 2012 WILEY-VCH Verlag GmbH & Co. KGaA.
International Search Report for PCT/KR2012/010336 dated Feb. 25, 2013, citing the above reference(s).

* cited by examiner

Normal Structure

Inverted Structure

FUNCTIONAL LAYER FOR ORGANIC ELECTRON DEVICE CONTAINING NON-CONJUGATED POLYMER HAVING AMINE GROUP, AND ORGANIC ELECTRON DEVICE CONTAINING SAME

CROSS REFERENCE TO RELATED APPLICATION

This application claims the priority of Korean Patent Application No. 10-2012-0056933 filed on May 29, 2012 in the Korean Patent and Trademark Office. Further, this application is the National Phase application of International Application No. PCT/KR2012/010336 filed on Nov. 30, 2012, which is incorporated herein by reference in its entirety.

TECHNICAL FIELD

The present invention relates to a functional layer for an organic electronic device, and an organic electronic device including the same, and more particularly, to a functional layer for an organic electronic device, which contains a non-conjugated polymer having an amine group, and an organic electronic device including the same.

BACKGROUND ART

Generally, a functional layer for an organic electronic device refers to a layer that is disposed between two electrodes in an organic electronic device, such as an organic light-emitting device, an organic solar cell or an organic transistor, in order to enhance the characteristics of the device.

Materials that are currently used for this functional layer for an organic electronic device can be largely divided into inorganic materials and organic materials. The inorganic materials can further be divided into metal oxides and metal carbonates, and the organic materials can further be divided into self-assembled monolayers (SAMs), conjugated polyelectrolytes, and polyethylene oxide.

Metal oxides have a high electron mobility, a low LUMO (lowest unoccupied molecular orbital) level and a high HOMO (highest occupied molecular orbital) level, and thus are widely used as materials for functional layers for organic electronic devices. However, these metal oxides have a problem in that high-temperature processes at 200° C. or higher are required to exhibit the characteristics of the metal oxides. Such high-temperature processes have a problem in that it is difficult to realize organic electronic devices on flexible substrates, because these processes are mostly performed at temperatures higher than the glass transition temperatures of the flexible substrates. In addition, in the case in which a functional layer of metal oxide is used in an organic solar cell having an inverted structure, there is a problem in that a photoactive material is deteriorated, because the efficiency of the inverted-type organic solar cell increases to approach the efficiency of an organic solar cell having a normal structure only when it is irradiated with ultraviolet (UV) light for a predetermined time.

Meanwhile, metal carbonates and self-assembled monolayers have problems in that they have difficulties in forming uniform ultrathin films and are also difficult to be applied to continuous printing processes. In addition, although conjugated polyelectrolytes function to control the work function of electrodes by inducing an interfacial dipole on the electrode surface and thus are widely used, they have a problem in that they are considered as a major cause of increasing the costs of organic electronic devices, because a process for the synthesis thereof is complex. In addition, polyethylene oxide has a low effect of inducing an interfacial dipole, and thus the use thereof for a functional layer for an organic electronic device has a limitation.

Accordingly, there is a need for the development of novel materials other than the above-described conventional materials that are used as materials for functional layers for organic electronic devices.

DISCLOSURE

Technical Problem

Exemplary embodiments of the present invention are intended to provide a functional layer for an organic electronic device, which contains a polymer material capable of overcoming the problems of a conventional functional layer material for an organic electronic device, and an organic electronic device including the same the same.

Technical Solution

In accordance with an aspect of the present invention, an organic electronic device may include a first electrode, a second electrode, and one or more organic material layers disposed between the first electrode and the second electrode, wherein the organic material layers may include an electron transport layer, and the electron transport layer may contain polyallylamine or polylysine.

The organic material layers may include a hole transport layer, and the hole transport layer may contain polyallylamine or polylysine.

The organic electronic device may be selected from the group consisting of an organic light-emitting device, an organic electrophosphorescent device, an organic solar cell, and an organic transistor.

The organic solar cell may be an organic solar cell having a normal structure, a series tandem organic solar cell having a normal structure, a parallel tandem organic solar cell having a normal structure, an organic solar cell having an inverted structure, a series tandem organic solar cell having an inverted structure, or a parallel tandem organic solar cell having an inverted structure.

Advantageous Effects

In exemplary embodiments of the present invention, a functional layer for an organic electronic device can be fabricated through a relatively simple low-temperature synthesis process by using a non-conjugated polymer having an amine group as a material for the functional material.

In addition, the functional layer for the organic electronic device, which contains the non-conjugated polymer having the amine group, can be easily fabricated as a thin layer, and can significantly control the work function of electrodes by inducing a strong interfacial dipole on the electrode surface.

DESCRIPTION OF DRAWINGS

FIG. 7 is a graph showing the luminous efficiencies of a Comparative Example and an Example in the organic light-emitting diode of FIG. 3a.

DESCRIPTION OF REFERENCE NUMERALS IN THE DRAWINGS

100: inverted organic solar cell;
110: substrate;
120: first electrode;
130: first functional layer;
140: photoelectric conversion layer;
150: second functional layer;
160: second electrode;
200: inverted tandem organic solar cell;
210: first electrode;
220: first functional layer;
230: first photoactive layer;
240: recombination layer;
241: second functional layer;
242: third functional layer;
250: second photoactive layer;
260: fourth functional layer;
270: second electrode;
300a: normal organic light-emitting diode;
310a: substrate and first electrode;
320a: first functional layer;
330a: light-emitting layer;
340a: second functional layer;
350a: second electrode;
300b: inverted organic light-emitting diode;
310b: substrate and first electrode;
320b: first functional layer;
330b: light-emitting layer;
340b: second functional layer; and
350b: second electrode.

MODE FOR INVENTION

Hereinafter, exemplary embodiments of the present invention will be described in detail.

A functional layer for an organic electronic device according to an embodiment of the present invention is characterized in that it contains a non-conjugated polymer that has an amine group in its chemical structure. As used herein, the expression "contains a non-conjugated polymer that has an amine group" means containing a non-conjugated polymer that has an amine group that has an amine group in the backbone or side chain of the polymer."

Herein, the non-conjugated polymer having the amine group may be polyethyleneimine, polyallylamine or polylysine, but is not limited thereto. In other words, a functional layer for an organic electronic device according to an embodiment of the present invention may contain any non-conjugated polymer having an amine group.

Polyethyleneimine, polyallylamine and polylysine, exemplified above as the non-conjugated polymer having the amine group, have the following structural formulas:

(polyethyleneimine)

Structural Formula 1

(polyallylamine)

Structural Formula 2

(polylysine)

Structural Formula 3

The non-conjugated polymer having the amine group is an organic material that does not require a high-temperature process and shows no ultraviolet (UV) light-dependent phenomenon, unlike conventional metal oxide materials. Thus, the non-conjugated polymer having the amine group has advantages in that, when it is used in an organic electronic device, the organic electronic device can be applied to a flexible substrate, because the flexible substrate is not deformed during the fabrication process, and in that, even when it is used in an inverted organic solar cell, deterioration of a photoactive material does not occur.

In addition, the non-conjugated polymer having the amine group has advantages in that it has an excellent ability to a thin film, and thus can form an ultrathin film, unlike metal carbonates or self-assembled monolayers, which have been used for functional layers in the prior art, and in that it can also be applied to continuous printing processes.

Moreover, the non-conjugated polymer having the amine group can be easily protonated when it is dissolved in water. Thus, it can significantly control the work function of electrodes by inducing a strong interfacial dipole on the electrode surface. Accordingly, it can reduce the energy bather between electrodes and photoactive materials, thereby contributing to improvement in the efficiency of the organic electronic device.

In other words, the non-conjugated polymer having the amine group has the effect of controlling the work function of electrodes to an equal or higher level by a relatively simple process compared to conventional polyelectrolytes, and has the advantage of controlling the work function of electrodes to a level higher than that achieved by non-ionic polyethylene oxide. The effects of an organic electronic device comprising this non-conjugated polymer having an amine group will be described in further detail through test examples below.

Meanwhile, the protonation of polyethyleneimine, polyallylamine and polylysine as exemplified above are shown below.

Protonation

-continued

The present invention provides an organic electronic device comprising a functional layer for an organic electronic device according to an embodiment of the present invention.

Herein, the organic electronic device means a device comprising a first electrode, a second electrode, and one or more organic layers disposed between the first electrode and the second electrode. Examples of this organic electronic device include, but are not limited to, an organic light-emitting device, an organic electrophosphorescent device, a polymer light-emitting diode, an organic solar cell, and an organic transistor. Also, examples of the organic solar cell include, but are not limited to, an organic solar cell having a normal structure, a series tandem organic solar cell having a normal structure, a parallel tandem organic solar cell having a normal structure, an organic solar cell having an inverted structure, a series tandem organic solar cell having an inverted structure, and a parallel tandem organic solar cell having an inverted structure. In addition, examples of the organic light-emitting device (or the polymer light-emitting diode) include, but are not limited to, an organic light-emitting device having a normal structure, a series tandem organic light-emitting device having a normal structure, a parallel tandem organic light-emitting device having a normal structure, an organic light-emitting device having an inverted structure, a series tandem organic light-emitting device having an inverted structure, and a parallel tandem organic light-emitting device having an inverted structure.

Hereinafter, application examples of an organic electronic device comprising a functional layer for an organic electronic device according to an embodiment of the present invention will be described. However, the application of a functional layer for an organic electronic device according to an embodiment of the present invention is not limited only to the following application examples. In other words, the following examples illustrate an organic solar cell having an inverted structure (Application Example 1), a tandem organic solar cell having an inverted structure (Application Example 2), and an organic light-emitting diode having a normal/inverted structure (Application Example 3), but a functional layer for an organic electronic device according to an embodiment of the present invention may also be applied to an organic solar cell or tandem organic solar cell having a normal structure.

Meanwhile, it is to be understood that the elements or layers of an organic electronic device, as described in the application examples of this specification, are based on the accompanying drawings. In other words, the following application examples may include not only a case composed only of the mentioned elements or layers, but also a case where other elements or layers is interposed or present between the mentioned elements or layers. However, for the convenience of explanation, the following application examples will be described with a focus on a case composed of the elements or layers shown in the drawings.

Application Example 1: Organic Solar Cell Having Inverted Structure

Figure 1:
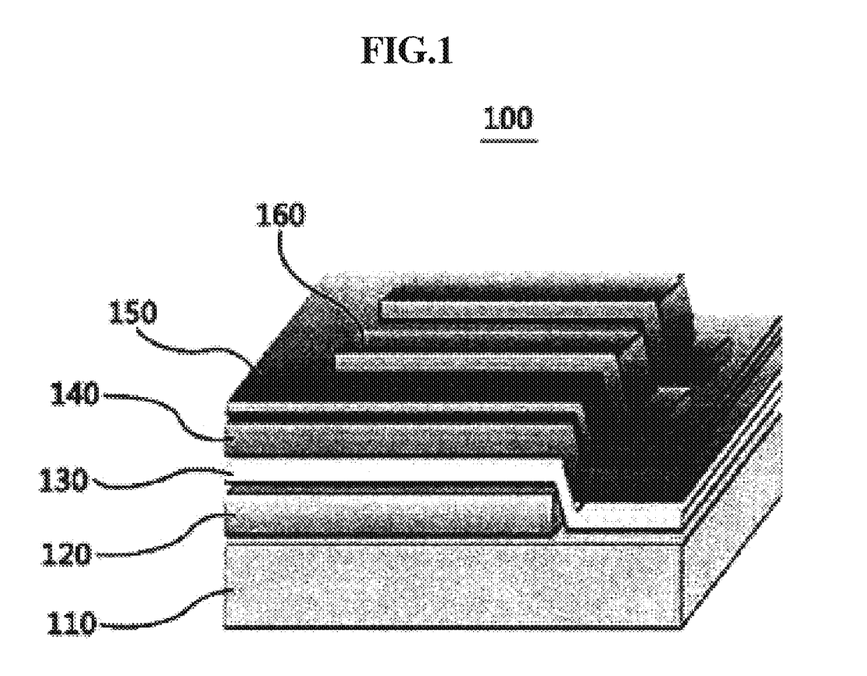
FIG. 1 is a view schematically showing an organic solar cell having an inverted structure.

FIG. 1 is a view schematically showing an organic solar cell 100 having an inverted structure (hereinafter referred to as "inverted organic solar cell").

Referring to FIG. 1, the inverted organic solar cell 100 may have a structure in which a substrate 100, a first electrode 120, a first functional layer 130, a photoelectric conversion layer 140, a second functional layer 150 and a second electrode 160 are sequentially deposited.

The substrate 110 may be made of glass or a flexible transparent material such as a plastic material, for example, polyethylene terephthalate (PET), polyethylene naphthalate (PEN), polypropylene (PP), polyimide (PI), polycarbonate (PC), polystyrene (PS), polyoxyethylene (POM), acrylonitrile styrene (AS) copolymer resin, acrylonitrile butadiene styrene (ABS) copolymer resin or triacetyl cellulose (TAC), but is not limited thereto. For example, the substrate 110 may be made of a semi-transparent or non-transparent material, or may also be coated with a semi-transparent or non-transparent metal electrode.

The first electrode 120 is an element functioning as a cathode, and may be made of a material having a work function greater than that of the second electrode 160. For example, the first electrode 120 may be made of indium tin oxide (ITO), gold, silver, fluorine-doped tin oxide (FTO), aluminum-doped zinc oxide (AZO), indium zinc oxide (IZO), ZnO—Ga$_2$O$_3$, ZnO—Al$_2$O$_3$, poly(3,4-ethylenedioxythiophene):poly(styrenesulfonate) (PEDOT:PSS), polyaniline:camphorsulfonic acid (PANI:CSA), graphene, carbon nanotubes (CNT), nanowires, or antimony tin oxide (ATO), but is not limited thereto, and any known material that functions as a cathode may be used for the first electrode 120.

The first functional layer 130 may function as an electron transport layer (or an electron capture layer). Herein, the first functional layer 130 may be a functional layer for an organic electronic device according to an embodiment of the present invention. Specifically, the first functional layer 130 may be a functional layer for an organic electronic device, which contains a non-conjugated polymer having an amine group. Examples of the non-conjugated polymer having the amine group include polyethyleneimine, polyallylamine, polylysine and the like.

When the first functional layer 130 is a functional layer for an organic electronic device, which contains a non-conjugated polymer having an amine group, it can lower the work function of the first electrode 120 by inducing a strong interfacial dipole. Thus, the cathode may be made of a material, such as ITO, PEDOT:PSS, PANI:CSA, graphene, a carbon nanotube material or a nanowire material, which is generally used for an anode.

The photoelectric conversion layer 140 has a bulk heterojunction (BHJ) structure in which an electron donor and an electron acceptor are present in a mixture. As the electron donor, a polymer semiconductor, a small-molecule semiconductor or the like may be used.

For example, the electron donor may be selected from the group consisting of poly(para-phenylene vinylene) (PPV)- based materials, polythiophene derivatives and phthalocyanine-based materials. Examples of such materials include, but are not limited to, polyaniline, polypyrrole, polythiophene, poly(p-phenylenevinylene), pentacene, poly(3,4-ethylenedioxythiophene) (PEDOT), poly(3-alkylthiophene), poly(3-hexylthiophene) (P3HT) and the like, and any known material may also be used as the electron donor.

Examples of the electron acceptor include, but are not limited to, fullerenes, such as $C_{60}$, $C_{70}$, $C_{76}$, $C_{78}$, $C_{82}$, $C_{90}$, $C_{94}$, $C_{96}$, $C_{720}$, $C_{860}$ and the like, which have high electron affinity; and fullerene derivatives such as 1-(3-methoxycarbonyl)propyl-1-phenyl(6,6)$C_{61}$ (PCBM), $C_{71}$-PCBM, $C_{84}$-PCBM, bis-PCBM, thienyl-$C_{61}$-butyricacidmethylester (ThCBM) and the like. In addition, any known material may be used as the electron acceptor.

The second functional layer 150 may function as a hole transport layer (or a hole capture layer). It may be made of at least one of poly(3,4-ethylenedioxythiophene): polystyrene sulfonate (PEDOT:PSS); metal oxides such as molybdenum oxide, vanadium oxide or tungsten oxide; conjugated or non-conjugated polyelectrolytes; self-assembled monolayers (SAMs), and the like, but is not limited thereto, and any known material may be used.

The second electrode 160 is an element functioning as an anode. It may be made of at least one of metals such as magnesium, calcium, sodium, potassium, titanium, indium, yttrium, lithium, gadolinium, aluminum, silver, tin and lead, and alloys thereof, but is not limited thereto, and any known material that functioning as an anode may be used.

Meanwhile, a method and process for fabricating the above-described inverted organic solar cell are the same as or similar to a known fabrication method and process, and thus the detailed description thereof is omitted.

Application Example 2: Tandem Organic Solar Cell Having Inverted Structure

Figure 2:
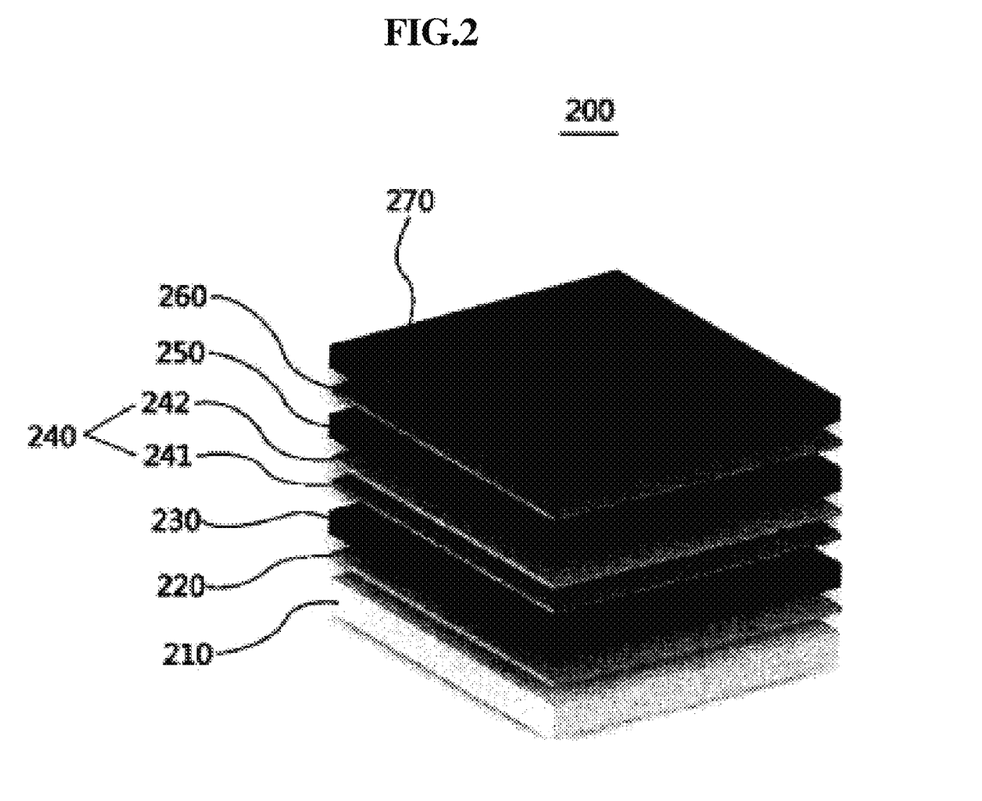
FIG. 2 is a view schematically showing a tandem organic solar cell having an inverted structure.

FIG. 2 is a view schematically showing a tandem organic solar cell 200 having an inverted structure (hereinafter referred to as "inverted tandem organic solar cell").

Referring to FIG. 2, the inverted tandem organic solar cell 200 may have a structure in which a first electrode 210, a first functional layer 220, a first photoactive layer 230, a recombination layer formed of a combination of a second functional layer 241 and a third functional layer 242, a second photoactive layer 250, a fourth functional layer 260 and a second electrode 270 are sequentially deposited on a substrate (not shown). Herein, the substrate may be a conventional substrate, and thus the detailed description thereof is omitted.

The first electrode 210, the first photoactive layer 230, the second photoactive layer 250 and the second electrode 270 may be made of materials that are the same as or similar to those described in Application Example 1 above, and thus the overlapping description thereof is omitted.

The first functional layer 220 can function as an electron transport layer, and serves to transport electrons, generated in the first photoactive layer 230, to the first electrode 210. Herein, the first functional layer 220 may be a functional layer for an organic electronic device according to an embodiment of the present invention. Specifically, the first functional layer 220 may be a functional layer for an organic electronic device, which contains a non-conjugated polymer having an amine group. Examples of the non-conjugated polymer having the amine group include polyethyleneimine, polyallylamine, polylysine and the like.

When the first functional layer 220 is a functional layer for an organic electronic device, which contains a non-conjugated polymer having an amine group, it can lower the work function of the first electrode 210 by inducing a strong interfacial dipole. Thus, the cathode may be made of a material, such as ITO, PEDOT:PSS, PANI:CSA, graphene, a carbon nanotube material or a nanowire material, which is generally used for an anode.

The recombination layer 240 is a layer in which holes generated in the first photoactive layer 230 are recombined with electrons generated in the second photoactive layer 250. It may consist of a combination of the second functional layer 241 and the third functional layer 242.

Herein, the second functional layer 241 functions to transport holes by allowing holes from the first photoactive layer 230 to be easily introduced therein and inhibiting the introduction of electrons. The second functional layer 241 may be made of a material such as a p-type semiconductor, metal oxide or PEDOT:PSS, but is not limited thereto, and any known material may be used for the second functional layer 241.

The third functional layer 242 functions to transport electrons by allowing electrons from the second photoactive layer 250 to be easily introduced therein and inhibiting the introduction of holes. The third functional layer 242 may be a functional layer for an organic electronic device according to an embodiment of the present invention. Specifically, the third functional layer 242 may be a functional layer for an organic electronic device, which contains a non-conjugated polymer having an amine group. Examples of the non-conjugated polymer having the amine group include polyethyleneimine, polyallylamine, polylysine and the like.

The fourth functional layer 260 can function as a hole transport, and serves to holes, generated in the second photoactive layer 250, to the second electrode 270.

The fourth functional layer 260 may be made of a material such as metal oxide or PEDOT:PSS, but is not limited thereto, and any known material may be used for the fourth functional layer 260.

Meanwhile, a method and process for fabricating the above-described inverted tandem organic solar cell are the same as or similar to a known fabrication method and process, and thus the detailed description thereof is omitted.

Application Example 3: Organic Light-Emitting Diode

Figure 3A:
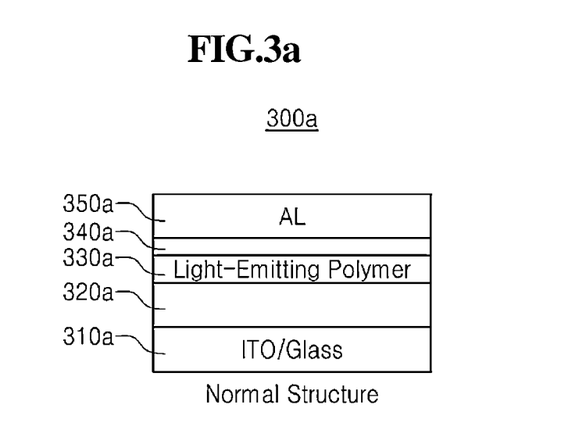
FIG. 3a is a view schematically showing an organic light-emitting diode having a normal structure.
Figure 3B:
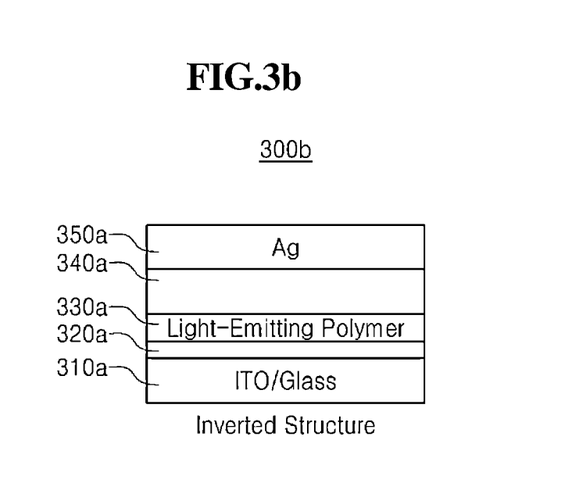
FIG. 3b is a view schematically showing an organic light-emitting diode having an inverted structure.

FIG. 3a is a view schematically showing an organic light-emitting diode 300a having a normal structure (hereinafter referred to as "normal organic light-emitting diode"), and FIG. 3b is a view schematically showing an organic light-emitting diode 300b having an inverted structure (hereinafter referred to as "inverted organic light-emitting diode").

The normal organic light-emitting diode 300a may have a structure in which a "substrate and first electrode" 310a, a first functional layer 320a, a light-emitting layer 330a, a second functional layer 340a and a second electrode 350a are sequentially deposited. The substrate and first electrode 310a, the light-emitting layer 330a and the second electrode 350a may be made of materials that are generally used in normal organic light-emitting diodes, and thus the detailed description thereof is omitted. Herein, "substrate and first electrode 310a" means a configuration in which the first electrode is formed on the substrate. In connection with this, it is noted that FIG. 3a shows the case in which the "substrate and first electrode" 310a is made of glass/ITO, and the second electrode 350a is made of Al.

The first functional layer 320a may be selected from among a hole injection layer, a hole transport layer and a combination of the hole injection layer and the hole transport layer, but is not limited thereto. In addition, the first functional layer 320a may be made of PEDOT:PSS, but is not limited thereto, and any known material may be used for the first functional layer 320a.

The second functional layer 340a may be selected from among an electron injection layer, an electron transport layer and a combination of the electron injection layer and the electron transport layer, but is not limited thereto. The second functional layer 340a may be a functional layer for an organic electronic layer according to an embodiment of the present invention. Specifically, it may be a functional layer for an organic electronic layer, which contains a non-conjugated polymer having an amine group. Examples of non-conjugated polymer having the amine group include polyethyleneimine, polyallylamine, polylysine and the like.

Meanwhile, the inverted organic light-emitting diode 300b may have a structure in which a "substrate and first electrode" 310b, a first functional layer 320b, a light-emitting layer 330b, a second functional layer 340b and a second electrode 350b are sequentially deposited. The "substrate and first electrode" 310b, the light-emitting layer 330b and the second electrode 350b may be made of materials that are generally used in inverted light-emitting diodes, and thus the detailed description thereof is omitted. In connection with this, it is noted that FIG. 3b shows the case in which the "substrate and first electrode" 310b is made of glass/ITO, and the second electrode 350b is made of Ag.

The first functional layer 320b may be selected from among an electron injection layer, an electron transport layer and a combination of the electron injection layer and the electron transport layer, but is not limited thereto. The first functional layer 320b may be a functional layer for an organic electronic layer according to an embodiment of the present invention. Specifically, it may be a functional layer for an organic electronic layer, which contains a non-conjugated polymer having an amine group. Examples of non-conjugated polymer having the amine group include polyethyleneimine, polyallylamine, polylysine and the like.

The second functional layer 340b may be selected from among a hole injection layer, a hole transport layer and a combination of the hole injection layer and the hole transport layer, but is not limited thereto. Also, the second functional layer 340b may be made of PEDOT:PSS, but is not limited thereto, and any known material may be used for the second functional layer 340b.

A method and process for fabricating the above-described normal/inverted organic light-emitting diode are the same as or similar to a known fabrication method and process, and thus the detailed description thereof are omitted.

As described above, a functional layer for an organic electronic device according to at least one embodiment of the present invention may be applied to various organic electronic devices, and when it is applied to an organic electronic device, it can enhance the characteristics of the organic electronic device.

Hereinafter, test examples of the present invention will be described. However, it is obvious that these test examples are not intended to limit the scope of the present invention.

Test Examples

Results of Measurement of Work Function

A Comparative Example and Examples were prepared as shown in Table 1, and each of materials corresponding to the comparative example and the examples was coated on an ITO thin film, thereby forming functional layers. Next, the work function of each of the ITO/functional layer stacks was measured. The materials corresponding to the examples were purchased from Sigma-Aldrich Corp., and the measurement of the work function was performed by Kelvin probe measurement.

TABLE 1

| | Materials |
|---|---|
| Comparative Example | Polyethylene oxide (hereinafter "PEO") |
| Example 1 | Polyallylamine (hereinafter "PAA") |
| Example 2 | Polylysine (hereinafter "PLS") |
| Example 3 | Polyethyleneimine (hereinafter "PEI") |

Figure 4:
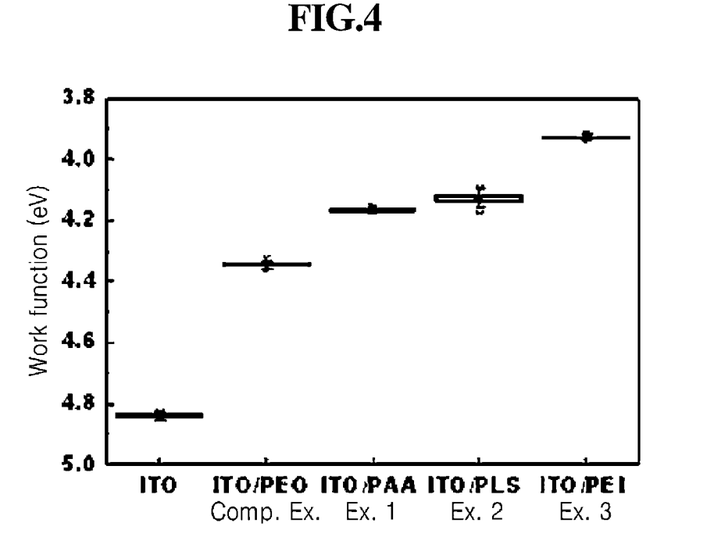
FIG. 4 is a graph showing the results of measurement of the work function of a Comparative Example and Examples.

FIG. 4 is a graph showing the results of measurement of the work function of the Comparative Example and the Examples. As shown in FIG. 4, the work function of the ITO film having no functional layer was about 4.8 eV. In the case of the ITO film to which PEO was applied as a functional layer (Comparative Example), the work function was about 4.4 eV, which was somewhat lower than that of the ITO film alone, but in the cases of the ITO films to which the non-conjugated polymer having an amine group, such as PAA, PLS or PEI, was applied (Examples 1 to 3), the work functions were about 4.2 eV, 4.1 eV and 4.0 eV, which were significantly lower than that of ITO film alone.

Results of Application to Organic Solar Cell

An organic solar cell having an inverted structure as shown in FIG. 1 was fabricated, in which the first functional layer 130 was formed using each of the Comparative Example and the Examples shown in Table 1 above.

The inverted organic solar cell was fabricated in the following manner. First, a glass substrate coated with ITO as a first electrode was washed, and cleaned by sonication in DI-water, acetone and IPA (isopropyl alcohol), followed by drying at 100° C. Then, contaminants remaining on the ITO surface were removed, and the ITO surface was hydrophilically modified by treatment with UV/ozone. Next, the ITO surface was spin-coated with each of materials corresponding to the Comparative Example and the Examples to form a functional layer on the surface, and the solvent was evaporated on a hot plate. Then, a P3HT:$PC_{70}BM$ solution prepared by blending poly(3-hexylthiophene) (P3HT) as an electron donor material with $PC_{70}BM$ as an electron acceptor material in chlorobenzene was spin-coated on the functional layer to form a photoactive layer, and the solvent was evaporated on a hot plate. Then, a PEDOT:PSS solution was spin-coated on the photoactive layer to form a thin layer, and the solvent was evaporated. Finally, Ag was deposited on the PEDOT:PSS layer in a vacuum chamber to form a second electrode, thereby fabricating an organic solar cell sample. The organic solar cell sample fabricated as described above had a structure consisting of glass/ITO/PEO, PAA, PLS or PEI/P3HT:$PC_{70}BM$/PEDOT:PSS/Ag, which were sequentially arranged from bottom to top.

Next, the efficiency of the organic solar cell fabricated as described above was measured, and the results of the measurement are shown in Table 2 below. In connection with this, FIG. 5 is a graph showing I-V curves of the Comparative Example and the Examples in the organic solar cell of FIG. 1.

TABLE 2

| | Open-circuit voltage ($V_{OC}$, V) | Short-circuit current ($J_{sc}$, mA/cm$^2$) | Fill factor (%) | Efficiency (%) |
|---|---|---|---|---|
| ITO | 0.12 | 2.71 | 23 | 0.7 |
| Comparative Example (ITO/PEO) | 0.52 | 9.09 | 47 | 2.21 |
| Example 1 (IPO/PAA) | 0.66 | 9.19 | 69 | 4.18 |
| Example 2 (ITO/PLS) | 0.66 | 9.23 | 66 | 4.04 |
| Example 3 (ITO/PEI) | 0.66 | 9.30 | 69 | 4.21 |

Figure 5:
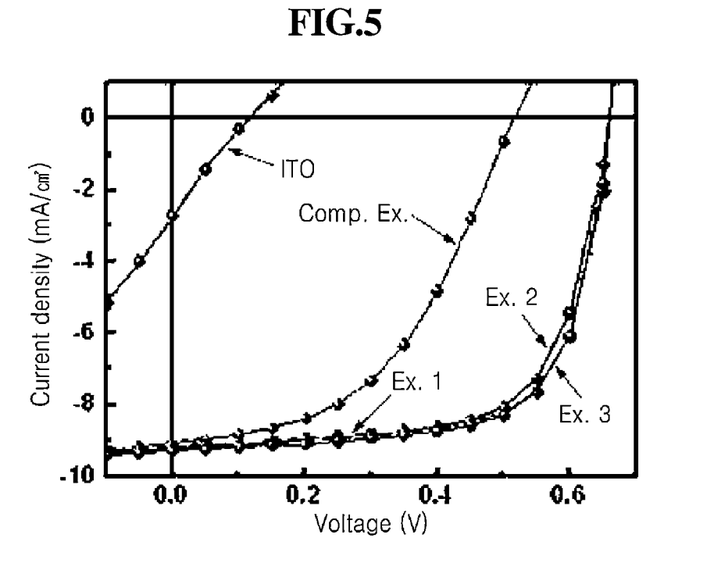
FIG. 5 is a graph showing I-V curves of a Comparative Example and Examples in the organic solar cell of FIG. 1.

As can be seen in Table 2 and FIG. 5, the energy conversion efficiency of the Examples was greatly higher than that of the Comparative Example. This is because the non-conjugated polymers having an amine group, which correspond to the Examples, induce a strong interfacial dipole to lower the work function of the ITO electrode, as described above, thereby facilitating electron collection.

Results of Application to Tandem Organic Solar Cell

A tandem organic solar cell having an inverted structure as shown in FIG. 2 was fabricated, in which the first functional layer 220 and the third functional layer 242 of the recombination layer 240 were formed using polyethyleneimine (PEI) corresponding to Example 3.

The inverted tandem organic solar cell was fabricated in the following manner. First, a glass substrate coated with ITO as a first electrode was washed, and cleaned by sonication in DI-water, acetone and IPA (isopropyl alcohol), followed by drying at 100° C. Then, contaminants remaining on the ITO surface were removed, and the ITO surface was hydrophilically modified by treatment with UV/ozone. Then, PEI was spin-coated on the ITO surface to form a functional layer (Example 3), and the solvent was evaporated on a hot plate. Then, a P3HT:PC$_{70}$BM solution was spin-coated on the functional layer to form a photoactive layer, and the solvent was evaporated on a hot plate. Then, a PEDOT:PSS solution was spin-coated on the photoactive layer to form a thin layer, and the solvent was evaporated. The above-described procedures were repeated once more, and then, finally, Ag was deposited on the PEDOT:PSS layer in a vacuum chamber to form a second electrode, thereby fabricating a tandem organic solar cell sample. The inverted tandem organic solar cell sample fabricated as described above had a structure consisting of glass/ITO/PEI/P3HT:PC$_{70}$BM/PEDOT:PSS/PEI/P3HT:PC$_{70}$BM/PEDOT:PSS/Ag, which were sequentially arranged from bottom to top.

Figure 6:
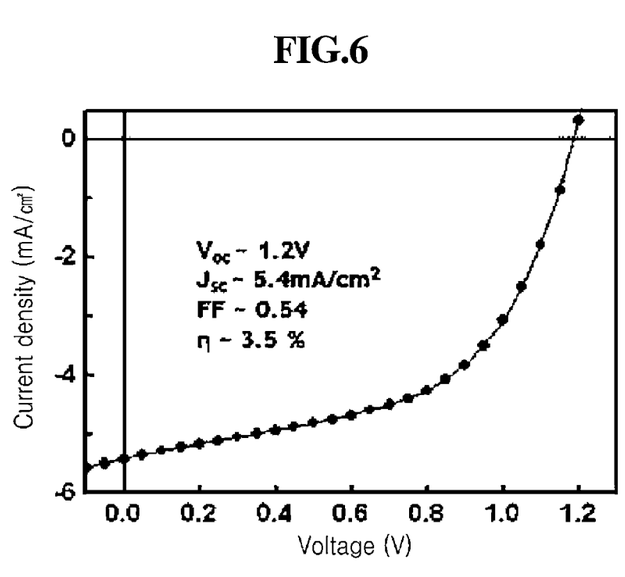
FIG. 6 is a graph showing I-V curves of a Comparative Example and Examples in the inverted organic solar cell of FIG. 2.

FIG. 6 is a graph showing I-V curves of the Example in the tandem organic solar cell of FIG. 2.

As shown in FIG. 6, the tandem organic solar cell comprising PEI had an open-circuit voltage ($V_{oc}$, V) of 1.2 V, a short-circuit current ($J_{sc}$, mA/cm$^2$) of 5.4 mA/cm$^2$, a fill factor of 0.54, and an efficiency of 3.5%, which was higher than the efficiency (1-2%) of general tandem organic solar cells.

Results of Application to Organic Light-Emitting Diode

The organic light-emitting diodes shown in FIGS. 3a and 3b were fabricated. The second functional layer 340a in the normal organic light emitting diode was formed using polyethyleneimine (PEI) corresponding to Example 3, and the luminous efficiency thereof was compared with that of Comparative Example 2 in which the second functional layer 340a was not present (see FIG. 3a).

The normal organic light-emitting diode was fabricated in the following manner. First, a glass substrate coated with ITO as a first electrode was washed, and cleaned by sonication in DI-water, acetone and IPA (isopropyl alcohol), followed by drying at 100° C. Then, contaminants remaining on the ITO surface were removed, and the ITO surface was hydrophilically modified by treatment with UV/ozone. Then, a PEDOT:PSS solution was spin-coated on the ITO surface, and the solvent was evaporated on a hot plate. Then, poly(9,9-dioctylfluorene) PFO blue (hereinafter "PFO") as a light-emitting layer solution was spin-coated on the PEDOT:PSS layer to form a light-emitting layer, and the solvent was evaporated on a hot plate. Then, PEI was spin-coated on the light-emitting layer to form a functional layer, and the solvent was evaporated. Finally, Al was deposited on the functional layer in a vacuum chamber to form a second electrode, thereby fabricating an organic light-emitting diode sample. Meanwhile, a sample of Comparative Example 2 was also fabricated by depositing Al directly on the light-emitting layer. The normal organic light-emitting diodes fabricated as described above had a structure of glass/ITO/PEDOT:PSS/PFO/PEI/Al (sequentially arranged from bottom to top; Example 3) and a structure of glass/ITO/PEDOT:PSS/PFO/Al (sequentially arranged from bottom to top; Comparative Example 2), respectively.

Figure 7:
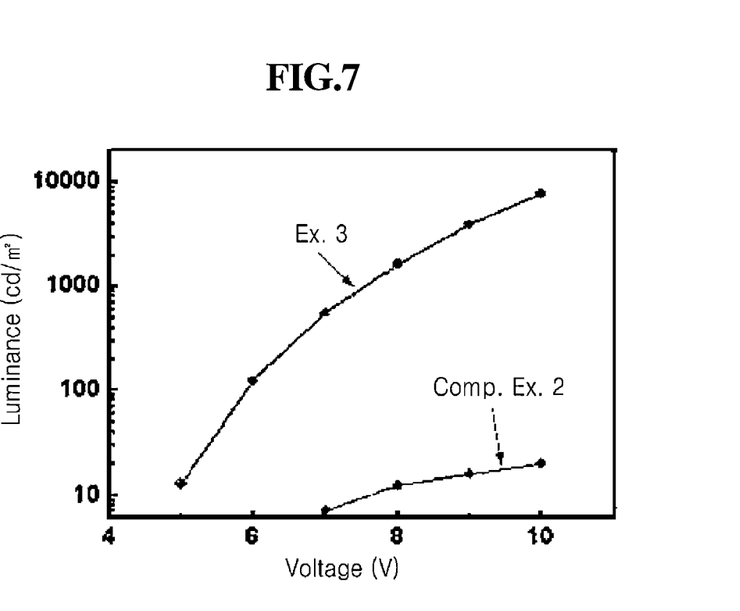

FIG. 7 is a graph showing the luminous efficiencies of the Comparative Example and the Example in the organic light-emitting diode of FIG. 3a.

As shown in FIG. 7, when the functional layer was formed of PEI (Example 3), the maximum luminance was measured to be 7753 cd/m$^2$ (10 V), and when the functional layer was not formed (Comparative Example 2), the maximum luminance was measured to be 36.7 cd/m$^2$ (13 V). Thus, it was found seen that, when the non-conjugated polymer having the amine group was used as the functional layer in the normal organic light-emitting diode, the efficiency of the organic light-emitting diode was significantly increased.

Meanwhile, the first functional layer 320b in the inverted organic light-emitting diode was formed using polyethyleneimine (PEI) corresponding to Example 3, and the luminous efficiency thereof was compared with that of Comparative Example 3 in which the first functional layer 320b was formed using TiO$_x$ (see FIG. 3b).

The inverted organic light-emitting diode was fabricated in the following manner.

First, a glass substrate coated with ITO as a first electrode was washed, and cleaned by sonication in DI-water, acetone and IPA (isopropyl alcohol), followed by drying at 100° C. Then, contaminants remaining on the ITO surface were removed, and the ITO surface was hydrophilically modified by treatment with UV/ozone. Then, PEI was spin-coated on the ITO to form a functional layer, and the solvent was evaporated. Then, poly[(9,9-di-n-octylfluorenyl-2,7-diyl)-alt-(benzo[2,1,3]thiadiazol-4,8-diyl)] (F8BT) green (hereinafter "F8BT") as a light-emitting layer solution was spin-coated on the functional layer to form a light-emitting layer, and the solvent was evaporated on a hot plate. Meanwhile, a sample of Comparative Example 3 was also fabricated by forming the light-emitting layer directly on the ITO. Next, a PEDOT:PSS solution was spin-coated on the light-emitting diode, and the solvent was evaporated on a hot plate. Finally, Ag was deposited on the PEDOT:PSS layer in a vacuum chamber to form a second electrode, thereby fabricating organic light-emitting diodes. The organic light-emitting diodes fabricated as described above had a structure of glass/ITO/PEI/F8BT/PEDOT:PSS/Ag (sequentially arranged from bottom to top; Example 3) and a structure of glass/ITO/F8BT/PEDOT:PSS/Ag (sequentially arranged from bottom to top; Comparative Example 3), respectively.

Figure 8:
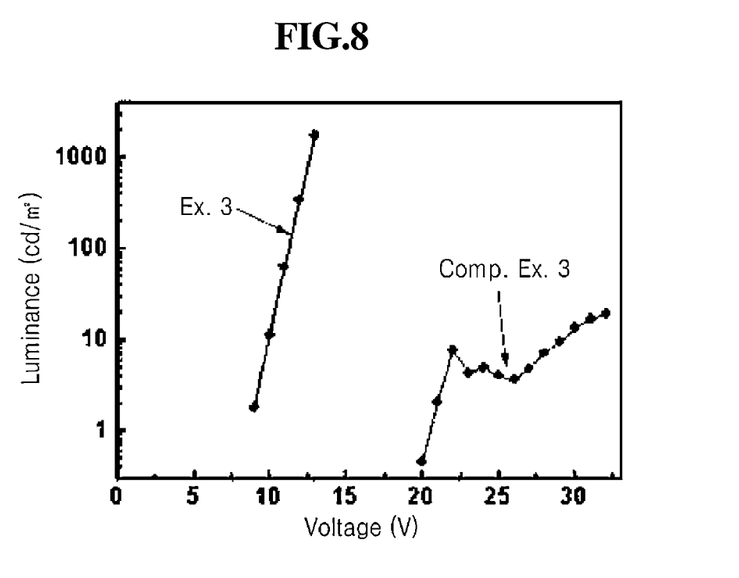
FIG. 8 is a graph showing the luminous efficiencies of a Comparative Example and an Example in the organic light-emitting diode of FIG. 3b.

FIG. 8 is a graph showing the luminous efficiencies of the Comparative Example and the Example in the organic light-emitting diode of FIG. 3b.

As shown in FIG. 8, when the functional layer was formed of PEI (Example 3), the maximum luminance was measured to be 1759 cd/m$^2$ (13V), and in the case of Comparative Example 3, the maximum luminance was measured to be 19.3 cd/m$^2$ (32V). Thus, it was found seen that, when the non-conjugated polymer having the amine group was used as the functional layer in the normal organic light-emitting diode, the efficiency of the organic light-emitting diode was significantly increased.

Although exemplary embodiments of the present invention have been disclosed, those skilled in the art will appreciate that the present invention can be modified and changed in various ways by the addition, change or deletion of any element without departing from the scope and spirit of the invention as disclosed in the accompanying claims.

The invention claimed is:

1. An organic electronic device comprising:
    a first electrode, wherein the first electrode is a cathode, and the first electrode comprises at least one material selected from the group consisting of indium tin oxide (ITO), PEDOT:PSS, camphorsulfonic acid (PANI: CSA), graphene, carbon nanotubes (CNT) and nanowires;
    a second electrode, wherein the second electrode acts is an anode, and the second electrode comprises at least one material selected from the group consisting of magnesium, calcium, sodium, potassium, titanium, indium, yttrium, lithium, gadolinium, aluminum, silver, tin, lead, and alloys thereof;
    a first electron transport layer (ETL) between the first electrode and the second electrode, wherein
        the first ETL consists of any one selected from the group consisting of polyethyleneimine, polyallylamine and polylysine, and
        the first ETL lowers a work function of the first electrode by inducing an interfacial dipole on the first electrode surface;
    a first hole transport layer (HTL) disposed on the second electrode between the first ETL and the second electrode; and
    one or more organic material layers between the first ETL and the first HTL, wherein the one or more organic material layers comprise a first photoelectric conversion layer, the first photoelectric conversion layer comprises an electron donor and an electron acceptor, and the electron donor and the electron acceptor form a bulk heterojunction (BHJ) structure.

2. The organic electronic device of claim 1, wherein the organic electronic device is selected from the group consisting of an organic light-emitting device, an organic electrophosphorescent device, an organic solar cell, and an organic transistor.

3. The organic electronic device of claim 2, wherein the organic solar cell is an organic solar cell having a normal structure, a series tandem organic solar cell having a normal structure, a parallel tandem organic solar cell having a normal structure, an organic solar cell having an inverted structure, a series tandem organic solar cell having an inverted structure, or a parallel tandem organic solar cell having an inverted structure.

4. The organic electronic device of claim 2, wherein the organic light-emitting device is an organic light-emitting device having a normal structure, a series tandem organic light-emitting device having a normal structure, a parallel tandem organic light-emitting device having a normal structure, a series tandem organic light-emitting device having an inverted structure, or a parallel tandem organic light-emitting device having an inverted structure.

5. An organic electronic device comprising:
    a first electrode;
    a second electrode;
    a first electron transport layer (ETL) between the first electrode and the second electrode, wherein
        the first ETL consists of one selected from the group consisting of polyethyleneimine, polyallylamine and polylysine, and
        the first ETL lowers a work function of the first electrode by inducing an interfacial dipole on the first electrode surface;
    a first hole transport layer (HTL) on the second electrode between the first ETL and the second electrode; and
    one or more organic material layers between the first ETL and the first HTL, wherein the one or more organic material layers comprise a first photoelectric conversion layer, the first photoelectric conversion layer comprises an electron donor and an electron acceptor, and the electron donor and the electron acceptor form a bulk heterojunction (BHJ) structure.

* * * * *